(12) United States Patent
Smith et al.

(10) Patent No.: US 12,114,419 B2
(45) Date of Patent: Oct. 8, 2024

(54) MICRO-GROUND VIAS FOR IMPROVED SIGNAL INTEGRITY FOR HIGH-SPEED SERIAL LINKS

(71) Applicant: Dell Products L.P., Round Rock, TX (US)

(72) Inventors: William Andrew Smith, Round Rock, TX (US); Mallikarjun Vasa, Secunderabad (IN); Bhyrav M. Mutnury, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 94 days.

(21) Appl. No.: 17/713,347

(22) Filed: Apr. 5, 2022

(65) Prior Publication Data
US 2023/0319978 A1    Oct. 5, 2023

(51) Int. Cl.
*H05K 1/02* (2006.01)
*H05K 1/11* (2006.01)
*H05K 3/42* (2006.01)

(52) U.S. Cl.
CPC ........... *H05K 1/0218* (2013.01); *H05K 1/115* (2013.01); *H05K 3/42* (2013.01); *H05K 2201/09518* (2013.01); *H05K 2201/09545* (2013.01)

(58) Field of Classification Search
CPC .. H05K 1/0216; H05K 1/0218; H05K 1/0228; H05K 1/0245; H05K 1/115; H05K 2201/09518; H05K 2201/09545; H05K 1/113; H05K 1/0251; H05K 1/112; H05K 1/116; H05K 2201/10401; H05K 2201/09645
See application file for complete search history.

(56) References Cited

U.S. PATENT DOCUMENTS

| | | | | |
|---|---|---|---|---|
| 3,739,469 A * | 6/1973 | Dougherty, Jr. | ....... | H05K 1/115 361/792 |
| 8,309,863 B2 * | 11/2012 | Kashiwakura | ......... | H05K 1/116 174/261 |
| 10,054,979 B1 | 8/2018 | Liao et al. | | |
| 10,784,608 B2 * | 9/2020 | Buck | ................ | H01R 13/6471 |
| 2007/0134953 A1 * | 6/2007 | Morana | ................ | H05K 1/117 439/76.1 |
| 2019/0289710 A1 | 9/2019 | Kumar et al. | | |

* cited by examiner

*Primary Examiner* — Roshn K Varghese
(74) *Attorney, Agent, or Firm* — Larson Newman, LLP

(57) ABSTRACT

An information handling system includes a printed circuit board, a surface mount connector including first and second surface mount connector portions, first and second different pairs, and a ground plane. The first and second surface mount connector portions are mounted on the printed circuit board. The first differential pair is located on the first surface mount connector portion, and the second differential pair is located on the second surface mount connector portion. The ground plane is located in between the first and second surface mount connector portions within the printed circuit board. The first ground via is in physical communication with the ground plane and a first ground pad on a surface of the printed circuit board. The second ground via is in physical communication with the ground plane and a second ground pad on the surface of the printed circuit board.

14 Claims, 9 Drawing Sheets

MICRO-GROUND VIAS FOR IMPROVED SIGNAL INTEGRITY FOR HIGH-SPEED SERIAL LINKS

FIELD OF THE DISCLOSURE

The present disclosure generally relates to information handling systems and more particularly relates to micro-ground vias for improved signal integrity for high-speed serial links.

BACKGROUND

As the value and use of information continue to increase, individuals and businesses seek additional ways to process and store information. One option is an information handling system. An information handling system generally processes, compiles, stores, or communicates information or data for business, personal, or other purposes. Technology and information handling needs, and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

An information handling system includes a printed circuit board, a surface mount connector including first and second surface mount connector portions, first and second different pairs, and a ground plane. The first and second surface mount connector portions may be mounted on the printed circuit board. The first differential pair may be located on the first surface mount connector portion, and the second differential pair may be located on the second surface mount connector portion. The ground plane may be located in between the first and second surface mount connector portions within the printed circuit board. The first ground via may be in physical communication with the ground plane and a first ground pad on a surface of the printed circuit board. The second ground via may be in physical communication with the ground plane and a second ground pad on the surface of the printed circuit board. The first and second ground vias may extend from the surface of the printed circuit board to the ground plane within the printed circuit board.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Figure 1:
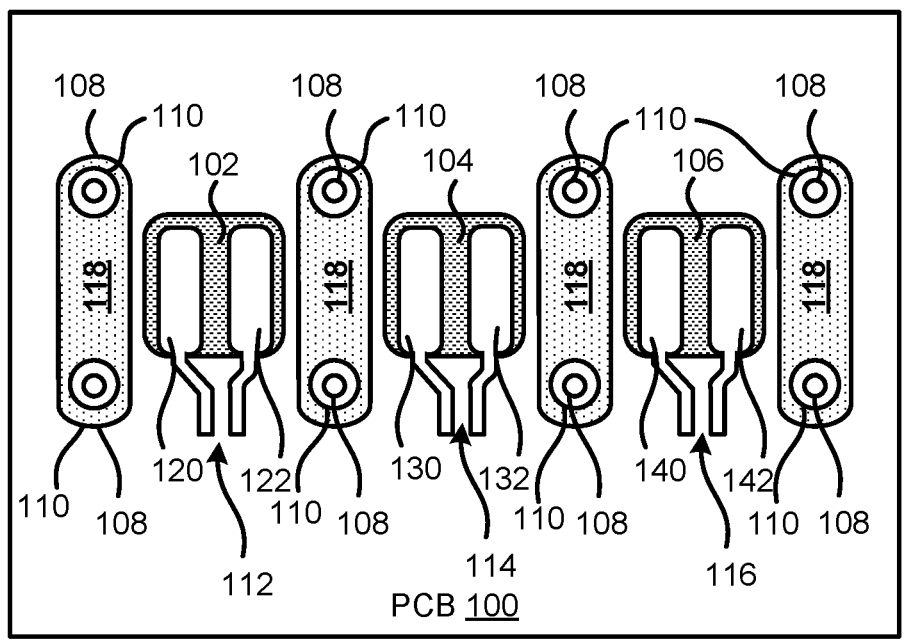
FIG. 1 is a diagram of a printed circuit board having a first ground via layout according to at least one embodiment of the present disclosure.
Figure 9:
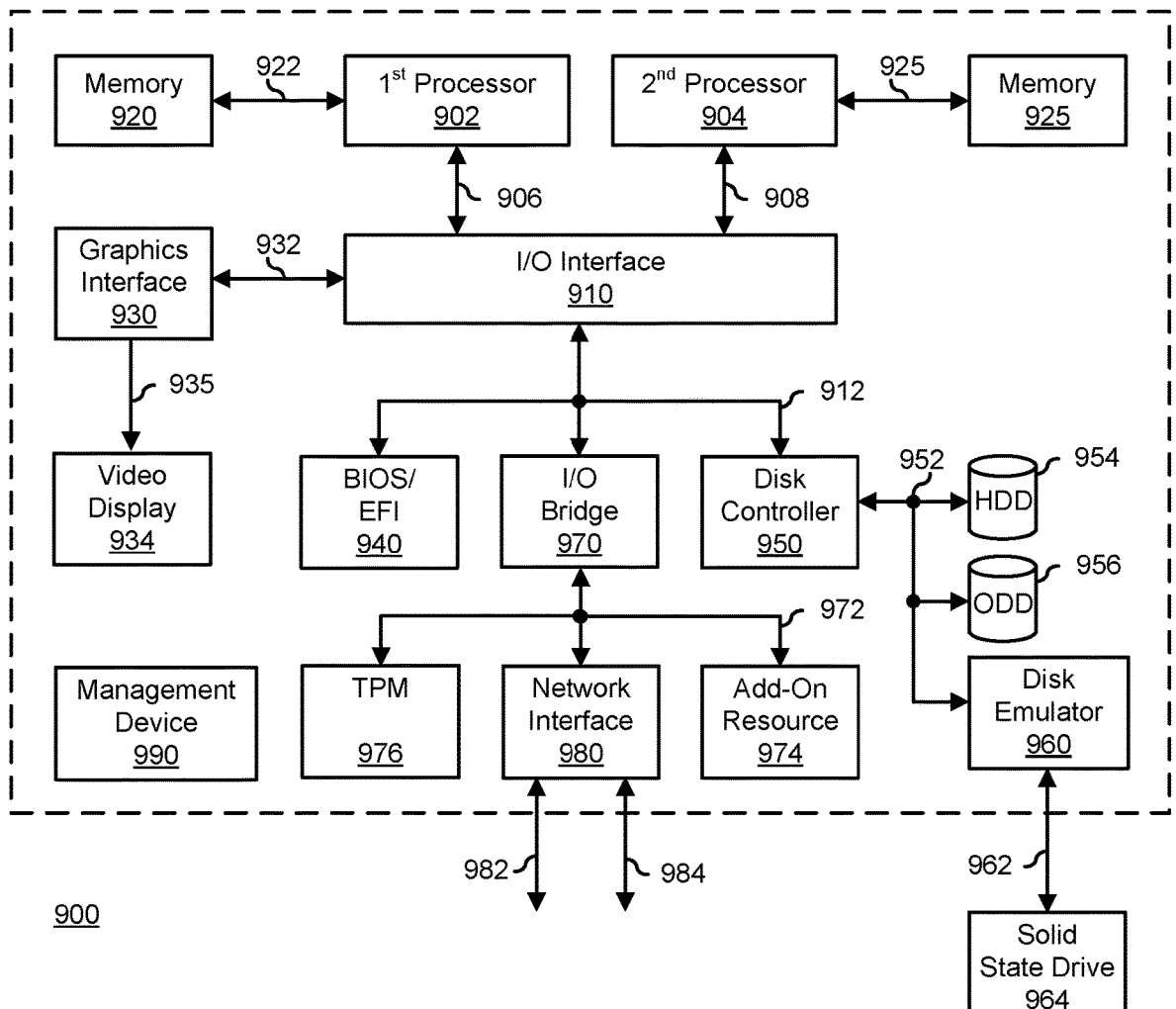
FIG. 9 is a block diagram of a general information handling system according to an embodiment of the present disclosure.

FIG. 1 illustrates a printed circuit board (PCB) 100 of an information handling system, such as information handling system 900 of FIG. 9, according to prior art in the field. For purpose of this disclosure information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system can be a personal computer, a laptop computer, a smartphone, a tablet device or other consumer electronic device, a network server, a network storage device, a switch, a router, or another network communication device, or any other suitable device and may vary in size, shape, performance, functionality, and price.

PCB 100 includes a single surface mount (SMT) connector with different SMT connector portions 102, 104, and 106, multiple ground vias 108, and multiple ground pads 110. Each SMT may provide both a physical connection and an electrical connection between a differential pair and PCB 100. For example, SMT connector portion 102 may be connected to a differential pair 112, SMT connector portion 104 may be connected to a differential pair 114, and SMT connector portion 106 may be connected to a differential pair 116. Ground vias 108 may connect ground pads 110 both physically and electrically to a respective one of multiple SMT ground pads 118 of SMT connector portion 102. Differential pair 112 includes conductors 120 and 122, differential pair 114 includes conductors 130 and 132, and differential pair 116 includes conductors 140 and 142. PCB 100 includes multiple inner conductor layers for ground planes and signal routing as will be described with respect to FIG. 3 below. In an example, PCB 100 may include additional components without varying from the scope of this disclosure.

In an example, SMT connector portions 102, 104, and 106 may be utilized to enable differential signals to be sent from PCB 100 to another PCB or device within the same information handling system. SMT connector portions 102, 104, and 106 do not need vias for connection to signal traces, and as a result, may enable inner layers of PCB 100 below the SMT connector portions to be utilized for signal routing. However, SMT connector portions 102, 104, and 106 may create a high amount of crosstalk between differential pairs 112, 114, and 116. In an example, the crosstalk generated or created by SMT connector portions 102, 104, and 106 may be reduced by utilizing toe-heel ground vias. Toe-heel ground vias may connect a ground pad, such as ground pad 110 around a via 108, on the surface of PCB 100 to a ground plane 118 within PCB 100.

In previous information handling systems, the toe-heel ground vias were through-hole vias, which extended completely through the PCB. While these through-hole toe-heel ground vias reduced the crosstalk between differential pairs in the previous information handling systems, the through-hole ground vias would block routing of other signals on inner layers of the PCB. If the through-hole ground vias were placed far away from the SMT connector portions in previous information handling systems, the routing of other signals would not be impacted but the crosstalk reduction would be ineffective. Alternatively, if the through-hole ground vias were placed near the SMT connector portions in previous information handling systems, through-hole ground vias would reduce the crosstalk but would block the routing of other signals on the inner layers of the PCB. PCB 100 of an information handling system may be improved by utilizing micro-ground vias or skip ground vias for crosstalk reduction. As will be described herein, the micro-ground vias and skip ground vias may provide a large amount of crosstalk reduction or immunity while not blocking the routing of signals on the inner layers of PCB 100.

In certain examples, ground vias 108 may be placed at any suitable location on PCB 100 to reduce crosstalk between differential pairs 112, 114, and 116. For example, ground vias 108 may be located in a substantially straight line next to SMT connector portion 102, in between SMT connector portions 102 and 104, in between SMT connector portions 104 and 106, and next to SMT connector portion 106. In certain examples, PCB 100 may include additional SMT connector portions not shown in FIG. 1 without varying from the scope of this disclosure.

Figure 3:
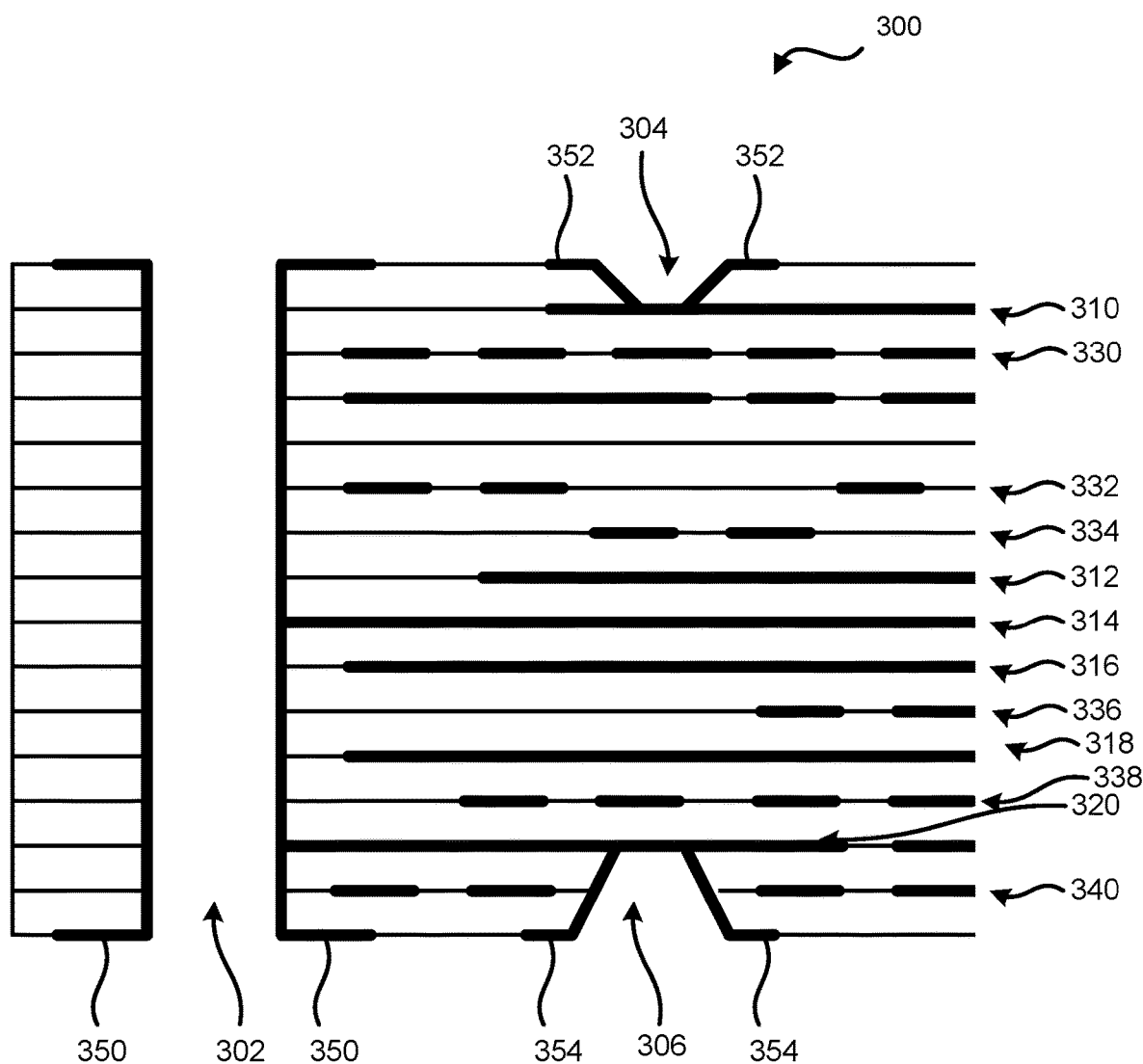
FIG. 3 is a diagram of a cross-section of a printed circuit board according to at least one embodiment of the present disclosure.

In an example, ground vias 108 may be formed via any suitable manner or operation. For example, ground vias 108 may be drilled, laser-etched, or like. Ground vias 108 may be either a micro-ground via or a skip ground via. In an example, as used herein a micro-ground via is a via that extends from a surface of PCB 100 to a first layer within the PCB as shown and described with respect to FIG. 3 below. As used herein, a skip ground via is a via that extends from a surface of PCB 100 to a second layer within the PCB as shown and described with respect to FIG. 3 below. In an example, ground vias 108 only extending to either the first inner layer or second inner layer of PCB 100 may increase the routing space for other high-speed signals within additional inner layers of the PCB. In certain examples, a particular ground via 108 may be a micro-via or a skip via based on a determination of whether a solid ground plane, such as ground plane 310 or 320 of FIG. 3, is located at the first inner layer or the second inner layer of PCB 100. While ground vias 108 are described herein as extending from the surface of PCB 100 to either the first or second inner layer of the PCB, the ground vias may extend to any suitable inner layer of the PCB where a first solid ground plane, such as ground plane 310 or 320 of FIG. 3, nearest the surface is located.

After ground vias 108 are created in PCB 100, the vias may be plated with a conductive material, such as copper. The plating of a via 108 is well known in the art and will not be described in detail herein. Each ground pad 110 may be provided around a respective ground via 108 on the surface of PCB 100 as shown in FIG. 1. Ground pads 110 may be provided in any manner known in the art including, but not limited to, plating a conductive material on the surface of PCB 100. In an example, the combination of ground vias 108, ground pads 110, and SMT ground pads 118 may be used as part of an electro-magnetic (EM) shield to reduce crosstalk between differential pairs 112 and 114, and between differential pairs 114 and 116 as will be shown and described with respect to FIG. 4 below.

Ground vias 108 and ground pads 110 are illustrated and described as being located on the same surface of PCB 100 as SMT connector portions 102, 104, and 106. However, ground vias 108 and ground pads 110 may be provided on a surface of PCB 100 that is opposite the surface where SMT connector portions 102, 104, and 106 are located without varying from the scope of this disclosure. Additionally, ground vias 108 and ground pads 110 may be provided on both surfaces of PCB 100, such as the same surface and the opposite surface as compared to SMT connector portions 102, 104, and 106, in a single implementation or design of a particular PCB. In certain examples, the placement and location of ground vias 108 on PCB 100 may be adjusted to improve signal routing below the ground vias as will be described with respect to FIG. 2 below. Additionally, the placement and location of ground vias 108 on PCB 100 may be adjusted to create or generate the most effective EM field protection and loss between adjacent differential pairs, such as differential pairs 112 and 114 and differential pairs 114 and 116, as will also be described with respect to FIG. 2 below.

Figure 2:
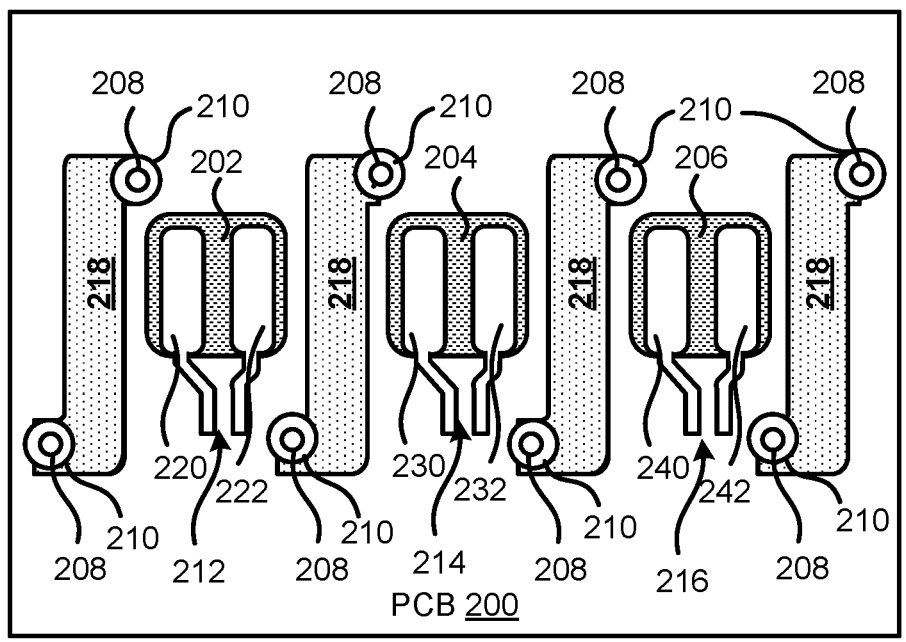
FIG. 2 is a diagram of the printed circuit board having a second ground via layout according to at least one embodiment of the present disclosure.

FIG. 2 illustrates a PCB 200 according to at least one embodiment of the present disclosure. PCB 200 includes a single SMT connector having multiple SMT connector portions 202, 204, and 206, multiple ground vias 208, and ground pads 210. Each SMT connector portion may provide both a physical connection and an electrical connection between a differential pair and PCB 200. For example, SMT connector portion 202 may be connected to a differential pair 212, SMT connector portion 204 may be connected to a differential pair 214, and SMT connector portion 206 may be connected to a differential pair 216. Ground vias 208 may connect ground pads 210 both physically and electrically to a respective one of multiple ground pads 218 of the SMT connector. Differential pair 212 includes conductors 220 and 222, differential pair 214 includes conductors 230 and 232, and differential pair 216 includes conductors 240 and 242.

PCB 200 includes multiple inner conductor layers for ground planes and signal routing as will be described with respect to FIG. 3 below. In an example, PCB 200 may include additional components without varying from the scope of this disclosure.

In an example, SMT connector portions 202, 204, and 206 may be utilized to enable differential signals to be sent from PCB 200 to another PCB or component within the same information handling system. SMT connector portions 202, 204, and 206 do not need vias for connection to signal traces, and as a result may enable inner layers of PCB 200 below the SMT connector portions to be utilized for signal routing. However, SMT connector portions 202, 204, and 206 may create a high amount of crosstalk between differential pairs 212, 214, and 216. In an example, the crosstalk generated or created by SMT connector portions 202, 204, and 206 may be reduced by the combination of a ground pad 218 of the SMT connector, a set of ground vias 208 and associated ground pads 210, and a ground plane, such as ground plane 310 or 320 of FIG. 3.

In certain examples, ground vias 208 may be placed at any suitable location on PCB 200 to reduce crosstalk between differential pairs 212, 214, and 216. For example, ground vias 208 may be located at an angle as compared a substantially straight line next to SMT connector portion 202, at an angle as compared a substantially straight line in between SMT connector portions 202 and 204, at an angle as compared a substantially straight line in between SMT connector portions 204 and 206, and at an angle, as compared a substantially straight line next to SMT connector portion 206. In certain examples, PCB 200 may include additional SMT connector portions not shown in FIG. 2 without varying from the scope of this disclosure. In an example, ground vias 208 is located at an angle that may increase the routing space for other high-speed signals within additional inner layers below the area of the PCB around SMT connector portions 202, 204, and 206.

In an example, ground vias 208 may be formed by any suitable manner or operation. For example, ground vias 208 may be drilled, laser-etched, or like. Ground vias 208 may be either a micro-ground via or a skip ground via. In an example, ground vias 208 only extending to either the first inner layer or second inner layer of PCB 200 may increase the routing space for other high-speed signals within additional inner layers of the PCB. In certain examples, a particular ground via 208 may be a micro-via or a skip via based on a determination of whether a solid ground plane, such as ground plane 310 or 320 of FIG. 3, is located at the first inner layer or the second inner layer of PCB 200. While ground vias 208 are described herein as extending from the surface of PCB 200 to either the first or second inner layer of the PCB, the ground vias may extend to any suitable inner layer of the PCB where a first solid ground plane nearest the surface is located.

After ground vias 208 are created in PCB 200, the vias may be plated with a conductive material, such as copper. Each ground pad 210 may be provided on the surface of PCB 200 around a ground via 208 as shown in FIG. 2. In an example, the combination of ground vias 208, ground pads 210, ground pads 218 of the SMT connector, and a ground plane may be used as part of an EM shield to reduce crosstalk between differential pairs 212 and 214, and between differential pairs 214 and 216 as will be shown and described with respect to FIG. 4 below.

Ground vias 208 and ground pads 210 are illustrated and described as being located on the same surface as SMT connector portions 202, 204, and 206. However, ground vias 208 and ground pads 210 may be provided on a surface of PCB 200 that is opposite the surface where SMT connector portions 202, 204, and 206 are located without varying from the scope of this disclosure. Additionally, ground vias 208 and ground pads 210 may be provided on both surfaces of PCB 200, such as the same surface and the opposite surface as compared to SMT connector portions 202, 204, and 206, in a single implementation or design of a particular PCB, as will also be described with respect to FIG. 3 below.

FIG. 3 illustrates a cross-section of a PCB 300 according to at least one embodiment of the present disclosure. PCB 300 may be substantially equal to PCB 100 of FIG. 1 and PCB 200 of FIG. 2. PCB 300 includes a through-hole via 302, a micro-via 304, and a skip via 306. PCB 300 also includes multiple inner layers including, but not limited to, ground plane layers 310, 312, 314, 316, 318, and 320 (310-320), and signal layers 330, 332, 334, 336, 338, and 340 (330-340). In certain examples, PCB 300 may include any suitable ground plane layers and signal layers and the ground and signal layers may be located in any suitable order without varying from the scope of this disclosure. Through-hole via 302 includes a plating layer 350, micro-via 304 includes a plating layer 352, and skip via 306 includes a plating layer 354.

For example, through-holes via 302 may connect the top and bottom surfaces of PCB 300. In certain examples, any suitable surface of PCB 300 may be identified as the top surface of the PCB, and the other surface may be identified as the bottom surface. As described herein, the top surface of PCB 300 is the surface including micro-via 304, and the bottom surface includes skip via 306. In an example, through-hole via 302 may inhibit routing of signals on signal layers 330-340 because the through-hole via intersects every inner layer of PCB 300 as shown in FIG. 3. Through hole via 302 may connect with ground planes 314 and 320 via plating layer 350 to provide a ground to components on the surface of PCB 300, such as SMT connector portions 102, 104, and 106 of FIG. 1 and SMT connector portions 202, 204, and 206 of FIG. 2. As stated above, signal routing in a PCB, such as PCB 300, may be improved by utilizing micro-via 304 and/or skip via 306.

In an example, micro-via 304 may be formed in any suitable manner including, but not limited to, laser drilling and laser etching. In certain examples, micro-via 304 may extend from the top surface of PCB 300 as shown in FIG. 3. However, micro-via 304 may extend from the bottom surface of the PCB without varying from the scope of this disclosure. In an example, micro-via 304 may be drilled from the top surface of PCB 300 to a first ground plane layer of the PCB, such as ground plane layer 310. In certain examples, ground plane layer 310 may be a solid ground plane to provide a full ground for micro-via 304.

As shown in FIG. 3, micro-via 304 is made from the top surface of PCB 300 to one layer below the surface. For example, if micro-via 304 is located on the bottom surface of PCB 300, the micro-via may be made from the bottom surface to one layer above the surface. In certain examples, micro-via 304 may be physically and electrically connected to ground plane layer 310 by any suitable manner, such as plating layer 352 being added to the micro-via. In an example, the portion of plating layer 352 on the top surface of PCB 300 may be a ground pad, such as ground pad 110 of FIG. 1 or ground pad 210 of FIG. 2. Micro-via 304, plating layer 352, and ground plane layer 310 may combine to provide EM shield to prevent crosstalk between differential pairs, such as differential pairs 112 and 114 or differential pairs 114 and 116 of FIG. 1 and differential pairs 212 and 214 or differential pairs 214 and 216 of FIG. 2. In this example, micro-via 304 may provide a good EM cage by connecting the ground pad of plating layer 352 to ground plane 310 and blocking EM fields that can cause crosstalk between differential signals. In an example, micro-via 304 may reduce the crosstalk between differential pairs without impacting or inhibiting routing of inner layers of PCB 300, such as signal layers 330-340.

In an example, skip via 306 may be formed in any suitable manner including, but not limited to, laser drilling and laser etching. In certain examples, skip via 306 may extend from the bottom surface of PCB 300 as shown in FIG. 3. However, skip via 306 may extend from the top surface of the PCB without varying from the scope of this disclosure. In an example, skip via 306 may be drilled from the bottom surface of PCB 300 to a first ground plane layer above the bottom surface, such as ground plane layer 320. In certain examples, ground plane layer 320 may be a solid ground plane to provide a full ground for skip via 306.

As shown in FIG. 3, skip via 306 is made from the bottom surface of PCB 300 to a second layer above the surface. In an example, if skip via 306 is located on the top surface of PCB 300, the skip via may be made from the top surface to a second layer above the surface. In certain examples, skip via 306 may be physically and electrically connected to ground plane layer 320 by any suitable manner, such as plating layer 354 being added to the skip via. In an example, the portion of plating layer 354 on the bottom surface of PCB 300 may be a ground pad, such as ground pad 110 of FIG. 1 or ground pad 210 of FIG. 2. Skip via 306, plating layer 354, and ground plane layer 320 may combine to provide EM shield to prevent crosstalk between differential pairs, such as differential pairs 112 and 114 or differential pairs 114 and 116 of FIG. 1 and differential pairs 212 and 214 or differential pairs 214 and 216 of FIG. 2. In this example, skip via 306 may provide a good EM cage by connecting the ground pad of plating layer 354 to ground plane 320 and blocking EM fields that can cause crosstalk between differential signals. In an example, skip via 306 may reduce the crosstalk between differential pairs while only impacting or inhibiting routing on one inner layer of PCB 300, such as signal layer 340. In this example, skip via 306 may still enable signal routing on inner layers 330-338 of PCB 300.

Figure 4:
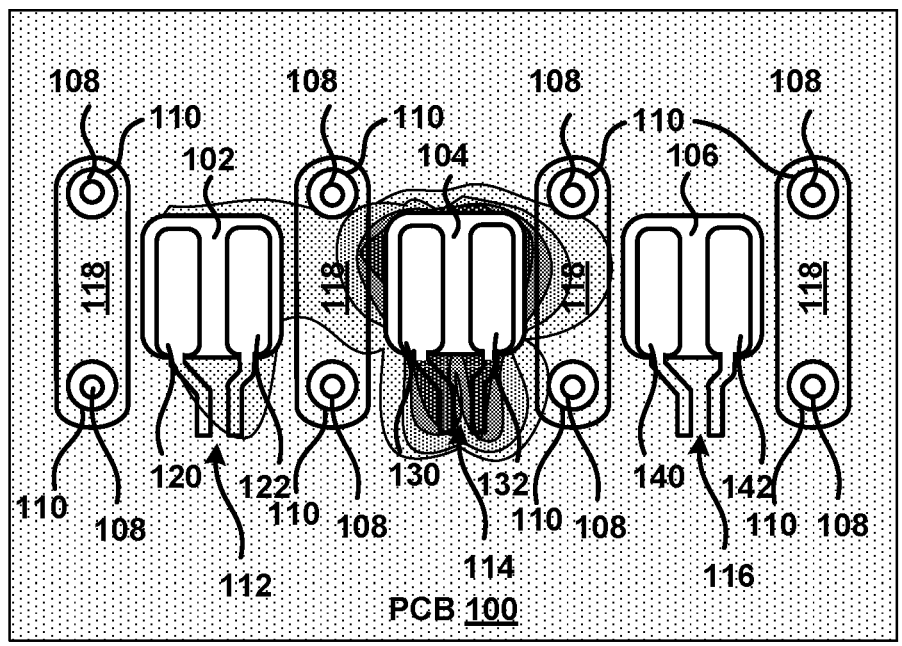
FIG. 4 is a diagram of electric field strength on the printed circuit board according to at least one embodiment of the present disclosure.
Figure 4:

FIG. 4 illustrates an electric field strength profile 400 on PCB 100 according to at least one embodiment of the present disclosure. While electric field strength profile 400 is illustrated with respect to PCB 100, the electric field strength profile may be substantially similar for PCB 200 of FIG. 2. Electric field strength profile 100 represents a strength map in dB of electric field distribution from SMT connector portion 104 and differential pair 114 over PCB 100. In particular, differential pair 114 and SMT connector portion 104 will be understood to be the major crosstalk producer for both differential pair 112 on SMT connector portion 102 and differential pair 116 on SMT connector portion 106, and so is seen to be in the region of the highest electric field on PCB 100.

In an example, the combination of ground vias 108, ground pads 110, and ground pads 118 in between differential pairs 114 and 112 and in between differential pairs 114 and 116 may reduce the crosstalk as illustrated by the reduction of the electric field at this combination of components. As illustrated in FIG. 4, the electric field produced by differential pair 114 decreases as a distance from the differential pair increases as seen by the reduction of the dB strength. It will be understood that electric field strength profile 400 is a simplified representation of the actual crosstalk characteristics of differential pair 114 on PCB 100. That is, the electric field strength at any given point will be understood to be within a range of dB strengths, as indicated by the provided legend, and the actual electric field strength profile on PCB 100 will likely not have large discrete steps in the strength, but will exhibit a smoothly varying electric field strength profile up to the combination of ground vias 108, ground pads 110, and SMT ground pads 118.

Thus, as shown by electric field strength profile 400 the combination of ground vias 108, ground pads 110, and SMT ground pads 118 may provide an EM shield between differential pairs 114 and 112 and differential pairs 114 and 116. Therefore, the combination of ground vias 108, ground pads 110, SMT ground pads 118, and a ground plane within PCB 100 may provide a crosstalk reduction between differential pairs 114 and 112 and differential pairs 114 and 116 as compared to ground vias located far away from SMT connector portions 102, 104, and 106.

Figure 5:
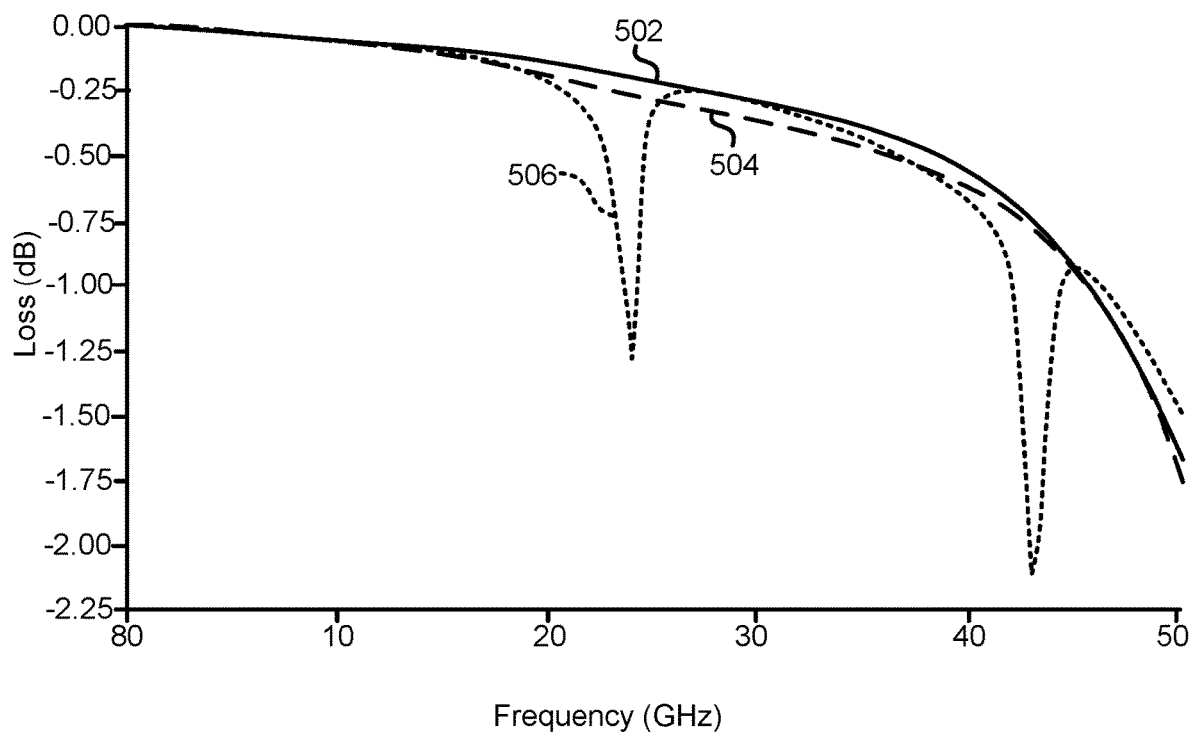
FIG. 5 illustrates insertion loss curves associated with ground vias layouts according to at least one embodiment of the present disclosure.

FIG. 5 illustrates insertion loss curves 502, 504, and 506 associated with different ground vias layouts according to at least one embodiment of the present disclosure. As shown in FIG. 5, the vertical axis indicates an amount of insertion loss in dB and the horizontal axis indicates a frequency in Gigahertz (GHz).

Insertion loss curve 502 may be associated with through-hole ground vias near SMT connector portions on a PCB according to previous information handling systems. Insertion loss curve 504 may be associated with micro-ground vias or skip ground vias near SMT connector portions on a PCB, such as SMT connector portions 102, 104, and 106 on PCB 100 as illustrated in FIG. 1 and SMT connector portions 202, 204, and 206 on PCB 200 as illustrated in 2. Insertion loss curve 506 may be associated with through-hole ground vias far from SMT connector portions on a PCB according to previous information handling systems.

As illustrated in FIG. 5, the insertion loss for micro-ground vias or skip ground vias, such as ground vias 108 of FIG. 1 or ground vias 208 of FIG. 2, may have a substantially similar insertion loss as compared to through-hole vias near SMT connector portions in previous PCBs as indicated by respective insertion loss curves 504 and 502. Additionally, the insertion loss for micro-ground vias or skip ground vias, such as ground vias 108 of FIG. 1 or ground vias 208 of FIG. 2, may have a substantially better insertion loss as compared to through-hole vias far from SMT connector portions in previous PCBs as indicated by respective insertion loss curves 504 and 506. Thus, micro-ground vias or skip vias may maintain good quality insertion losses while enabling signal routing on inner layers of a PCB as described above with respect to FIGS. 1-3.

Figure 6:
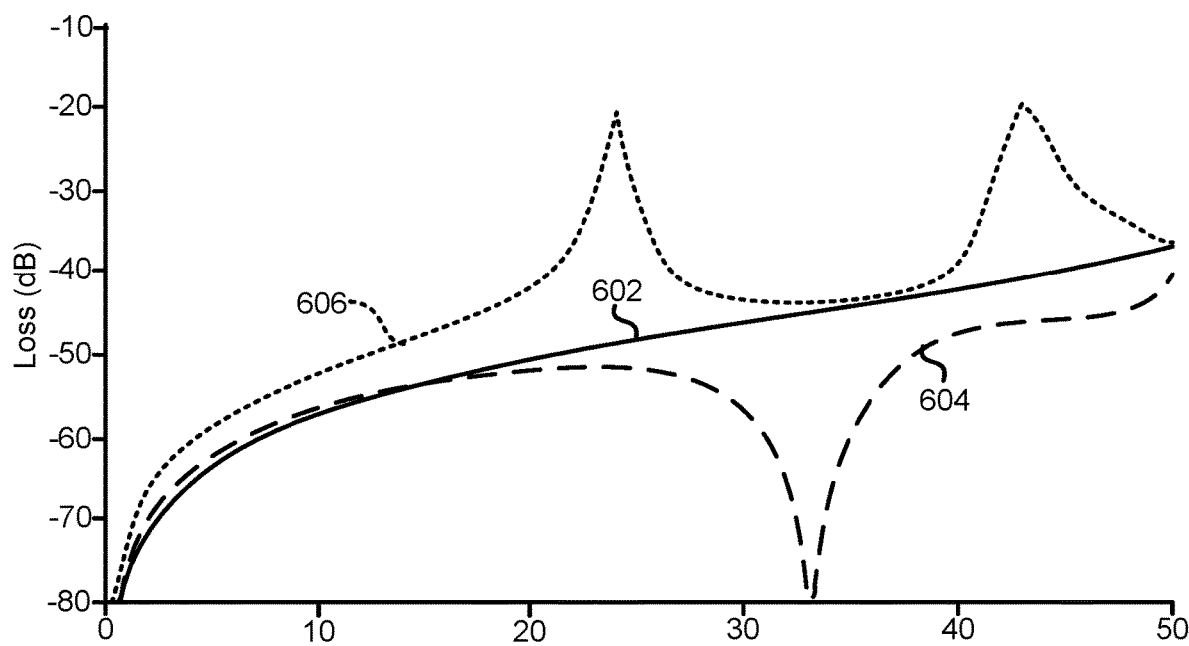
FIG. 6 illustrates near-end crosstalk curves associated with ground vias layouts according to at least one embodiment of the present disclosure.

FIG. 6 illustrates near-end crosstalk (NEXT) curves 602, 604, and 606 associated with different ground vias layouts according to at least one embodiment of the present disclosure. As shown in FIG. 6, the vertical axis indicates an amount of loss for crosstalk between differential pairs in dB and the horizontal axis indicates a frequency in Gigahertz (GHz). In an example, the location of ground vias for differential pairs may affect NEXT between the differential pairs at a given frequency.

As illustrated in FIG. 6, the NEXT for micro-ground vias or skip ground vias, such as ground vias 108 of FIG. 1 or ground vias 208 of FIG. 2, may have a substantially similar crosstalk loss as compared to through-hole vias near SMT connector portions in previous PCBs as indicated by respective NEXT loss curves 604 and 602. Additionally, the NEXT for micro-ground vias or skip ground vias may have a more reduction of crosstalk as compared to through-hole vias near SMT connector portions in previous PCBs for a particular frequency range, such as around 34 GHz, as indicated by respective NEXT loss curves 604 and 602. The NEXT loss for micro-ground vias or skip ground vias may have a substantially better crosstalk reduction as compared to through-hole vias far from SMT connector portions in previous PCBs as indicated by respective NEXT loss curves 604 and 606. Thus, micro-ground vias or skip vias may improve NEXT reduction as compared to through-hole vias far from SMT connector portions and maintain NEXT reduction as compared to through-hole vias near SMT connector portions while enabling signal routing on inner layers of a PCB as described above with respect to FIGS. 1-3.

Figure 7:
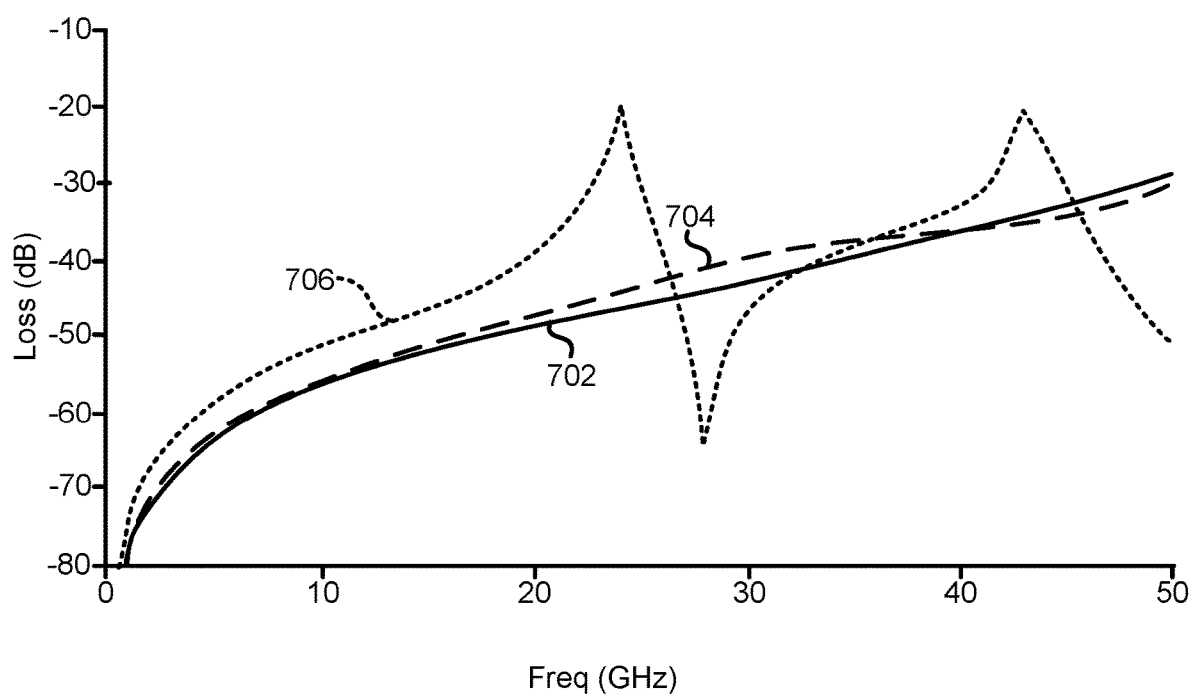
FIG. 7 illustrates far-end crosstalk curves associated with ground vias layouts according to at least one embodiment of the present disclosure.

FIG. 7 illustrates far-end crosstalk (FEXT) curves 702, 704, and 706 associated with ground vias layouts according to at least one embodiment of the present disclosure. As shown in FIG. 6, the vertical axis indicates an amount of loss for crosstalk between differential pairs in dB and the horizontal axis indicates a frequency in Gigahertz (GHz). In an example, the location of ground vias for differential pairs may affect NEXT between the differential pairs at a given frequency.

As illustrated in FIG. 7, the FEXT for micro-ground vias or skip ground vias, such as ground vias 108 of FIG. 1 or ground vias 208 of FIG. 2, may have a substantially similar crosstalk loss as compared to through-hole vias near SMT connector portions in previous PCBs as indicated by respective FEXT loss curves 704 and 702. Additionally, the FEXT loss for micro-ground vias or skip ground vias may have a substantially better crosstalk reduction as compared to through-hole vias far from SMT connector portions in previous PCBs as indicated by respective NEXT loss curves 704 and 706. Thus, micro-ground vias or skip vias may improve FEXT reduction as compared to through hole vias far from SMT connector portions and maintain FEXT reduction as compared to through hole vias near SMT connector portions while enabling signal routing on inner layers of a PCB as described above with respect to FIGS. 1-3.

Figure 8:
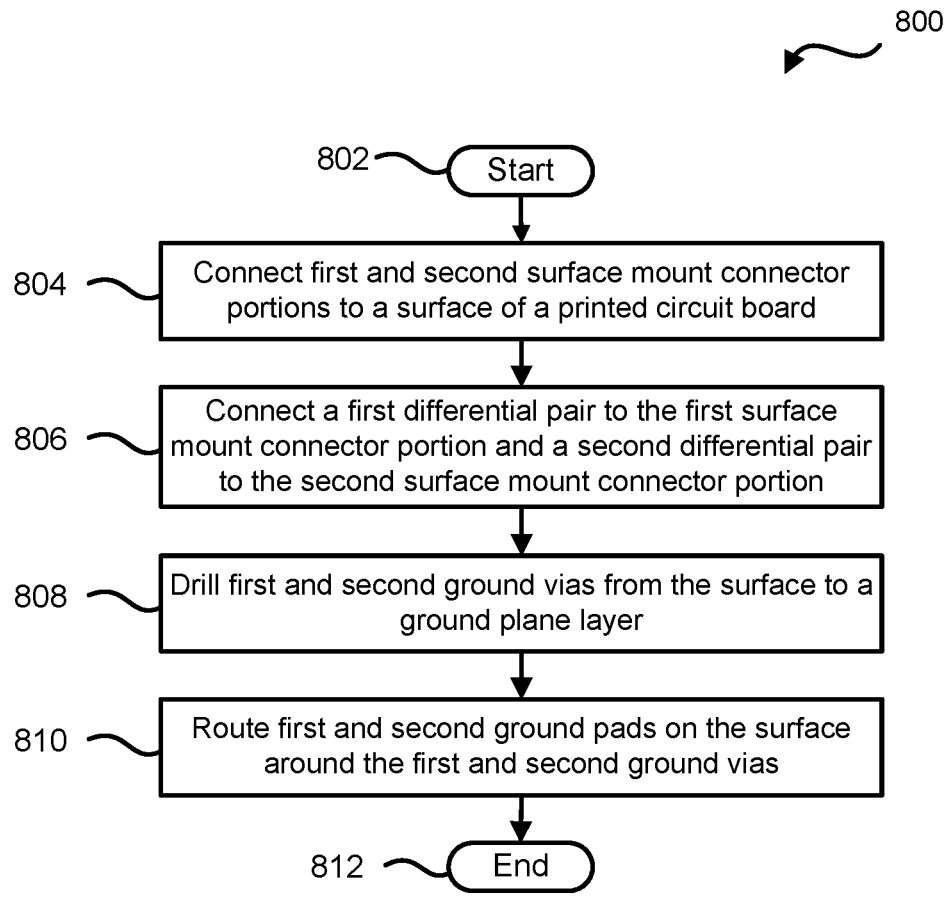
FIG. 8 is a flow diagram of a method for connecting a ground plane to a ground plane by ground via according to at least one embodiment of the present disclosure.

FIG. 8 is a flow diagram of method 800 for connecting a ground plane to a ground plane by ground via according to at least one embodiment of the present disclosure, starting a block 802. It will be readily appreciated that not every method step set forth in this flow diagram is always necessary and that certain steps of the methods may be combined, performed simultaneously, in a different order, or perhaps omitted, without varying from the scope of the disclosure. FIG. 8 may be employed in whole, or in part, any other type of controller, device, module, processor, or any combination thereof, operable to employ all, or portions of, the method of FIG. 8.

At block 804, the first and second surface mount connector portions are connected to a surface of a PCB of an information handling system. At block 806, first and second differential pairs are connected to the respective first and second surface mount connector portions. In an example, each of the differential pairs includes respective first and second conductors to create the differential pair. The differential pairs may be utilized to provide signals from the PCB to another PCB of the information handling system. In certain examples, the signals provided by the differential pairs may be high-speed signals.

At block 808, first and second ground vias are drilled from the surface of the PCB to a ground plane within the PCB. In certain examples, the first and second ground vias may be located at any suitable positions or locations near the surface mount connector portions. For example, the ground vias may be positioned in a substantially straight line in between the first and second surface mount connector portions may be positioned at different angles from a substantially straight line between the first and second surface mount connector portions, or the like.

In an example, the ground plane may be any suitable solid ground plane of the PCB. In an example, the ground plane may be the first layer within the PCB from the surface. In this example, the ground vias may be micro-ground vias that do not block the routing of other signals in the inner layers of the PCB. In an example, the ground plane may be a second within the PCB from the surface. In this example, the ground vias may be skipped ground vias, and a maximum of one signal layer may be blocked by the ground vias. In certain examples, another set of two ground vias may be drilled on a surface of the PCB that is opposite of the surface with the surface mount connector portions.

At block 810, first and second ground pads are routed on the surface of the printed circuit board and the flow ends at block 812. For example, the first ground pad may be routed around the first ground via and the second ground pad may be routed around the second ground via. In an example, a combination of the ground plane, the ground vias, and the ground pads may block fields generated by the first surface mount connector portion from causing crosstalk at the second surface mount connector portion.

FIG. 9 illustrates a generalized embodiment of an information handling system 900. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 900 can be a personal computer, a laptop computer, a smartphone, a tablet device or other consumer electronic device, a network server, a network storage device, a switch router or other network communication device, or any other suitable device and may vary in size, shape, performance, functionality, and price. Further, information handling system 900 can include processing resources for executing machine-executable code, such as a central processing unit (CPU), a programmable logic array (PLA), an embedded device such as a System-on-a-Chip (SoC), or other control logic hardware. Information handling system 900 can also include one or more computer-readable medium for storing machine-executable code, such as software or data. Additional components of information handling system 900 can include one or more storage devices that can store machine-executable code, one or more communications ports for communicating with external devices, and various input and output (I/O) devices, such as a keyboard, a mouse, and a video display. Information handling system 900 can also include one or more buses operable to transmit information between the various hardware components.

Information handling system 900 can include devices or modules that embody one or more of the devices or modules described below and operates to perform one or more of the methods described below. Information handling system 900 includes processors 902 and 904, an input/output (I/O) interface 910, memories 920 and 925, a graphics interface 930, a basic input and output system/universal extensible firmware interface (BIOS/UEFI) module 940, a disk controller 950, a hard disk drive (HDD) 954, an optical disk drive (ODD) 956, a disk emulator 960 connected to an external solid state drive (SSD) 964, an I/O bridge 970, one or more add-on resources 974, a trusted platform module (TPM) 976, a network interface 980, and a management device 990. Processors 902 and 904, I/O interface 910, memory 920, graphics interface 930, BIOS/UEFI module 940, disk controller 950, HDD 954, ODD 956, disk emulator 960, SSD 964, I/O bridge 970, add-on resources 974, TPM 976, and network interface 980 operate together to provide a host environment of information handling system 900 that operates to provide the data processing functionality of the information handling system. The host environment operates to execute machine-executable code, including platform BIOS/UEFI code, device firmware, operating system code, applications, programs, and the like, to perform the data processing tasks associated with the information handling system 900.

In the host environment, processor 902 is connected to I/O interface 910 via processor interface 906, and processor 904 is connected to the I/O interface via processor interface 908. Memory 920 is connected to processor 902 via a memory interface 922. Memory 925 is connected to processor 904 via a memory interface 922. Graphics interface 930 is connected to I/O interface 910 via a graphics interface 932, and provides a video display output 934. In a particular embodiment, information handling system 900 includes separate memories that are dedicated to each of processors 902 and 904 via separate memory interfaces. An example of memories 920 and 925 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 940, disk controller 950, and I/O bridge 970 are connected to I/O interface 910 via an I/O channel 912. An example of I/O channel 912 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 910 can also include one or more other I/O interfaces, including an Industry Standard Architecture (ISA) interface, a Small Computer Serial Interface (SCSI) interface, an Inter-Integrated Circuit (I2C) interface, a System Packet Interface (SPI), a Universal Serial Bus (USB), another interface, or a combination thereof. BIOS/UEFI module 940 includes BIOS/UEFI code operable to detect resources within information handling system 900, to provide drivers for the resources, initialize the resources, and access the resources. BIOS/UEFI module 940 includes code that operates to detect resources within information handling system 900, to provide drivers for the resources, to initialize the resources, and to access the resources.

Disk controller 950 includes a disk interface 952 that connects the disk controller to HDD 954, to ODD 956, and to disk emulator 960. An example of disk interface 952 includes a Peripheral Component Interconnect Express (PCIe), Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 960 permits SSD 964 to be connected to information handling system 900 via an external interface 962. An example of external interface 962 includes a USB interface, an IEEE 1394 (Firewire) interface, a proprietary interface, or a combination thereof. Alternatively, solid-state drive 964 can be disposed within information handling system 900.

I/O bridge 970 includes a peripheral interface 972 that connects the I/O bridge to add-on resource 974, to TPM 976, and to network interface 980. Peripheral interface 972 can be the same type of interface as I/O channel 912, or can be a different type of interface. As such, I/O bridge 970 extends the capacity of I/O channel 912 when peripheral interface 972 and the I/O channel are of the same type, and the I/O bridge translates information from a format suitable to the I/O channel to a format suitable to the peripheral channel 972 when they are of a different type. Add-on resource 974 can include a data storage system, an additional graphics interface, a network interface card (NIC), a sound/video processing card, another add-on resource, or a combination thereof. Add-on resource 974 can be on a main circuit board, on separate circuit board or add-in card disposed within information handling system 900, a device that is external to the information handling system, or a combination thereof.

Network interface 980 represents a NIC disposed within information handling system 900, on a main circuit board of the information handling system, integrated onto another component such as I/O interface 910, in another suitable location, or a combination thereof. Network interface device 980 includes network channels 982 and 984 that provide interfaces to devices that are external to information handling system 900. In a particular embodiment, network channels 982 and 984 are of a different type than peripheral channel 972 and network interface 980 translates information from a format suitable to the peripheral channel to a format suitable to external devices. An example of network channels 982 and 984 includes InfiniBand channels, Fiber Channel channels, Gigabit Ethernet channels, proprietary channel architectures, or a combination thereof. Network channels 982 and 984 can be connected to external network resources (not illustrated). The network resource can include another information handling system, a data storage system, another network, a grid management system, another suitable resource, or a combination thereof.

Management device 990 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 900. In particular, management device 990 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 900, such as system cooling fans and power supplies. Management device 990 can include a network connection to an external management system, and the management device can communicate with the management system to report status information for information handling system 900, to receive BIOS/UEFI or system firmware updates, or to perform other task for managing and controlling the operation of information handling system 900. Management device 990 can operate off of a separate power plane from the components of the host environment so that the management device receives power to manage information handling system 900 when the information handling system is otherwise shut down. An example of management device 990 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 990 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An information handling system comprising:
a printed circuit board;
a surface mount connector mounted on the printed circuit board, the surface mount connector includes first and second surface mount connector portions;
a first differential pair on the first surface mount connector portion;
a second differential pair on the second surface mount connector portion;
a ground pad of the surface mount connector located in between the first and second surface mount connector portions;
a first ground via in physical communication with a first ground plane within the printed circuit board, with the ground pad of the surface mount connector, and with a first ground pad on a surface of the printed circuit board, wherein the first ground via is a micro-via, wherein the first ground pad is in physical communication with the ground pad of the surface mount connector; and
a second ground via in physical communication with a second ground plane within the printed circuit board, with the ground pad of the surface mount connector, and with a second ground pad on the surface of the printed circuit board, wherein a signal layer is located in a plane of the printed circuit board in between a surface of the printed circuit board and the second ground plane, wherein the second ground pad is in physical communication with the ground pad of the surface mount connector, wherein the second ground via is a skip via, wherein the first and second ground pads are on a same surface of the printed circuit board, wherein the first and second ground vias extend from the surface of the printed circuit board to respective ones of the first and second ground planes within the printed circuit board.

2. The information handling system of claim 1, wherein the printed circuit board includes:
multiple layers within the printed circuit board, wherein a signal trace is routed on a layer of the multiple layers located further from the surface than the ground plane.

3. The information handling system of claim 1, wherein the first ground plane is a solid ground plane in a layer near the surface of the printed circuit board.

4. The information handling system of claim 3, wherein the layer is a first layer away from the surface of the printed circuit board.

5. The information handling system of claim 1, wherein the second ground plane is a solid ground plane in a second layer away from the surface of the printed circuit board.

6. The information handling system of claim 1, wherein a combination of the first and second ground planes, the ground pad of the surface mount connector, the first and second ground vias, and the first and second ground pads blocks fields generated by the first surface mount connector portion from causing crosstalk at the second surface mount connector portion.

7. The information handling system of claim 1, wherein the first and second ground vias are positioned in a substantially straight line in between the first and second surface mount connector portions.

8. The information handling system of claim 1, wherein the first and second ground vias are positioned at different angles from a substantially straight line between the first and second surface mount connector portions.

9. An information handling system comprising:
a printed circuit board including multiple inner layers;
a surface mount connector mounted on the printed circuit board, the surface mount connector includes first and second surface mount connector portions;
a first differential pair on the first surface mount connector portion;
a second differential pair on the second surface mount connector portion;
a ground pad of the surface mount connector located in between the first and second surface mount connector portions within the printed circuit board;
a first ground via in physical communication with a first ground plane within the printed circuit board, with the ground pad of the surface mount connector, and with a first ground pad on a surface of the printed circuit board, wherein the first ground via is a micro-via, wherein the first ground pad is in physical communication with the ground pad of the surface mount connector; and
a second ground via in physical communication with a second ground plane within the printed circuit board, with the ground pad of the surface mount connector, and with a second ground pad on the surface of the printed circuit board, wherein a signal layer is located in a plane of the printed circuit board in between a surface of the printed circuit board and the second ground plane, wherein the second ground pad is in physical communication with the ground pad of the surface mount connector, wherein the second ground via is a skip via, wherein the first and second ground pads are on a same surface of the printed circuit board, wherein the first and second ground vias extend from the surface of the printed circuit board to respective ones of the first and second ground planes within the printed circuit board, wherein a combination of the first and second ground planes, the ground pad of the surface mount connector, the first and second ground vias, and the first and second ground pads blocks fields generated by the first surface mount connector portion from causing crosstalk at the second surface mount connector portion.

10. The information handling system of claim 9, wherein the first ground plane is a solid ground plane in a layer near the surface of the printed circuit board.

11. The information handling system of claim 10, wherein the layer is a first layer away from the surface of the printed circuit board.

12. The information handling system of claim 9, wherein the second ground plane is a solid ground plane in a second layer away from the surface of the printed circuit board.

13. The information handling system of claim 9, wherein the first and second ground vias are positioned in a substantially straight line in between the first and second surface mount connector portions.

14. The information handling system of claim 9, wherein the first and second ground vias are positioned at different angles from a substantially straight line between the first and second surface mount connector portions.

* * * * *